(12) United States Patent
Farmer et al.

(10) Patent No.: US 10,096,513 B2
(45) Date of Patent: Oct. 9, 2018

(54) DIRECT PLASMA DENSIFICATION PROCESS AND SEMICONDUCTOR DEVICES

(71) Applicant: Intel Corporation, Santa Clara, CA (US)

(72) Inventors: Jason A. Farmer, Hillsboro, OR (US); Jeffrey S. Leib, Hillsboro, OR (US); Daniel B. Bergstrom, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/619,283

(22) Filed: Jun. 9, 2017

(65) Prior Publication Data

US 2017/0278748 A1    Sep. 28, 2017

Related U.S. Application Data

(63) Continuation of application No. 15/100,531, filed as application No. PCT/US2013/077813 on Dec. 26, 2013, now Pat. No. 9,711,399.

(51) Int. Cl.
*H01L 23/00*         (2006.01)
*H01L 21/768*        (2006.01)
(Continued)

(52) U.S. Cl.
CPC .. *H01L 21/76856* (2013.01); *H01L 21/28088* (2013.01); *H01L 21/76843* (2013.01);
(Continued)

(58) Field of Classification Search
CPC ................................. H01L 21/76856
See application file for complete search history.

(56) References Cited

U.S. PATENT DOCUMENTS 5,970,378 A    10/1999    Shue et al.
7,691,749 B2   4/2010     Levy et al.
(Continued)

FOREIGN PATENT DOCUMENTS

EP    1077477 A       2/2001
JP    2000058650 A    2/2000
(Continued)

OTHER PUBLICATIONS

Straten, et al.; "Impact of Direct Plasma Densification on Resistivity and Conformality of PEALD Tantalum Nitride"; Abstract #2476, Honolulu PRiME 2012, The Electrochemical Society, 1 page, 2012.
(Continued)

*Primary Examiner* — William Harriston
(74) *Attorney, Agent, or Firm* — Grossman, Tucker, Perreault & Pfleger, PLLC

(57) ABSTRACT

An aspect of the present disclosure relates to a method of forming a barrier layer on a semiconductor device. The method includes placing a substrate into a reaction chamber and depositing a barrier layer over the substrate. The barrier layer includes a metal and a non-metal and the barrier layer exhibits an as-deposited thickness of 4 nm or less. The method further includes densifying the barrier layer by forming plasma from a gas proximate to said barrier layer and reducing the thickness and increasing the density of the barrier layer. In embodiments, during densification 300 Watts or less of power is applied to the plasma at a frequency of 350 kHz to 40 MHz.

21 Claims, 6 Drawing Sheets

(51) Int. Cl.
    H01L 21/28    (2006.01)
    H01L 23/532   (2006.01)
    H01L 23/528   (2006.01)
    H01L 21/285   (2006.01)
    H01L 29/51    (2006.01)

(52) U.S. Cl.
    CPC ...... *H01L 21/76867* (2013.01); *H01L 23/528* (2013.01); *H01L 23/53238* (2013.01); *H01L 23/53266* (2013.01); *H01L 21/28562* (2013.01); *H01L 29/517* (2013.01)

(56) References Cited

U.S. PATENT DOCUMENTS

| | | |
|---|---|---|
| 7,989,902 B2 | 8/2011 | Ando et al. |
| 2008/0207006 A1 | 8/2008 | Martin et al. |
| 2008/0274624 A1 | 11/2008 | Hasegawa |
| 2010/0151676 A1* | 6/2010 | Ritchie ............... C23C 16/34 438/660 |
| 2011/0183508 A1 | 7/2011 | Chan et al. |
| 2013/0075833 A1 | 3/2013 | Liu et al. |
| 2013/0264620 A1 | 10/2013 | Yu et al. |

FOREIGN PATENT DOCUMENTS

| | | |
|---|---|---|
| WO | 2003-033169 A1 | 4/2003 |
| WO | 2013-048449 A1 | 4/2013 |
| WO | 2013-090099 A1 | 6/2013 |

OTHER PUBLICATIONS

International Search Report and Written Opinion received for PCT Application No. PCT/US2013/077813, dated Sep. 25, 2014, 14 pages.
International Preliminary Report on Patentability and Written Opinion received for PCT Application No. PCT/US2013/077813, dated Jul. 7, 2016, 10 pages.
Taiwanese Office Action/Decision of Rejection issued in Taiwanese Application No. 103140469, dated Sep. 30, 2016, with English translation, 5 pages.
European Extended Search Report issued in European Application No. 13900291.9, dated Aug. 1, 2017, 10 pages.
Velose, A., et al.: "Effective Work 13-15 INV. Function Engineering for Aggressively Scaled Planar and Multi-Gate Fin Field-Effect Transistor-Based Devices with High-k Last Replacement Metal Gate Technology", Japanese Journal of Applied Physics, Japan Society of Applied Physics, vol. 52, No. 4/2, Apr. 1, 2013, 7 pages, XPQ01584516, ISSN: 0021-4922, DOI: 10.7567/JJAP.52.04CA02 [retrieved on Mar. 21, 2013].
Kim, J. Y., et al.: "Remote Plasma-Enhanced Atomic-Layer Deposition of Tin by Using TDMAT With a NH3 Plasma", Journal of the Korean Physical Soc, Korean Physical Society, vol. 45, No. 6, Dec. 1, 2004, pp. 1639-1643, XP009058133.
Taiwanese Allowance Decision of Re-Examination issued in Taiwanese Application No. 103140469, dated Oct. 17, 2017, with English translation, 3 pages.
Chinese Office Action issued in Chinese Application No. 201380081215.4, dated May 28, 2018, with English translation, 25 pages.

* cited by examiner

DIRECT PLASMA DENSIFICATION PROCESS AND SEMICONDUCTOR DEVICES

CROSS-REFERENCE TO RELATED APPLICATION

The present application is a continuation of U.S. patent application Ser. No. 15/100,531 filed May 31, 2016, which is a National Stage Entry of PCT/US2013/77813, filed Dec. 26, 2013, the entire disclosures of which are incorporated herein by reference.

FIELD

The present disclosure is directed to the direct plasma densification processes of barrier layers.

BACKGROUND

Many challenges have arisen as semiconductor device critical dimensions have decreased. In addition to scaling, contact critical dimensions have decreased due to the presence of non-planar geometries, such as fins and nanowires. Therefore, the thickness of barrier layers, such as TiN, is preferably reduced to allow sufficient metal conductor fill and provide reasonable metal conductor resistance. Barrier layers protect underlying metal from attack by precursors or other compounds that the underlying metal may be exposed to in the processing environment. Barrier layers may also be used to provide an adhesion layer.

Thinning of a barrier layer, however, allows plasma to penetrate into the underlying metal or semiconductor layer during the plasma densification process. Plasma penetration into the underlying layers may force elements from the barrier layer, such as nitrogen or oxygen, into the underlying layer. For example, in titanium/titanium nitride layers, plasma nitridization of the underlying titanium can occur. Presently, reduction of plasma nitridization of the underlying metal may be prevented by increasing the thickness of the barrier layer to the loss of performance in metal line resistance and trench pinch-off causing fill defects. Thus, room for improvement remains in plasma densification processes of barrier layers in semiconductor devices.

BRIEF DESCRIPTION OF THE DRAWINGS

The above-mentioned and other features of this disclosure, and the manner of attaining them, may become more apparent and better understood by reference to the following description of embodiments described herein taken in conjunction with the accompanying drawings, wherein.

DESCRIPTION

Figure 1:
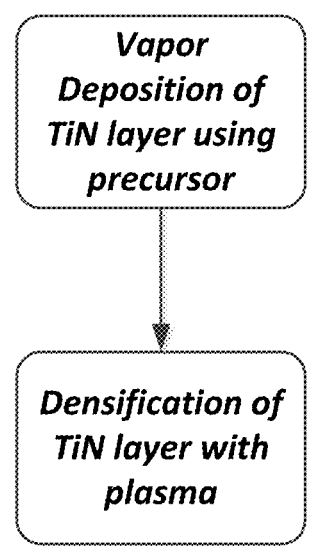
FIG. 1 illustrates a flow chart of a general embodiment of the methods described herein.

In addition to reductions of contact critical dimensions due to scaling of semiconductor devices, contact critical dimensions have decreased due to the incorporation of non-planar geometries, such as fins and nanowires, in the devices. To achieve sufficient metal conductor fill and achieve a sufficient conductor cross-sectional area to provide reasonable metal conductor resistance at critical dimensions of less than 30 nm the thickness of barrier layers, and particularly TiN barrier layers, has to be similarly reduced. Barrier layers protect underlying metal from attack by precursors or other compounds that the underlying metal may be exposed to in the processing environment. Barrier layers may also be used to provide an adhesion layer.

Plasma densification reduces the barrier layer thickness and increases barrier layer density. This improves barrier properties and prevents pinch-off, which detrimentally impacts later deposition processes. Plasma densification processes generally apply a power of 500 W or greater to the densification plasma, bombarding the barrier layer with plasma ions. However, upon thinning of the barrier layers due to scaling, the plasma at this power undesirably penetrates into the underlying metal during densification converting the metal to a nitride. This reduces the overall performance of the device affecting its resistivity and other properties. Furthermore, at higher power, the densification process is not tunable.

The present disclosure is directed to a plasma densification process for densifying barrier layers having a thickness of less than 4 nm, by applying power to the densification plasma at 300 W or less. The process, in embodiments, is directed to semiconductor devices including one or more features, such as transistors, contacts, or interconnects, exhibiting a critical dimension of 30 nm or less, such as in the range of 5 nm to 30 nm, including all values and increments therein, an preferably from 5 nm to 22 nm, and more preferably from 5 nm to 14 nm, and more preferably from 5 nm to 11 nm, etc. A critical dimension may be understood as the dimension of the smallest geometric feature (width of interconnect line, contact, trenches, etc.) of the semiconductor device formed or exposed at a given step in the process flow. The process maintains the underlying layer integrity and allows tunability of the barrier layers.

As alluded to above, a barrier layer, and in particular embodiments, a TiN barrier layer, may be used at contact metal to silicon interfaces or gate metal stacks to prevent diffusion of the metal conductor material into the underlying silicon substrate or surrounding interlayer dielectric layers. The barrier layer also, in embodiments, provides an adhesion layer for metals deposited over the barrier layer. In addition, the barrier layer also allows for the use of gasses or other compounds later introduced in subsequent process steps, such as tungsten hexafluoride, that may attack the layers underlying the barrier layer. The barrier layer includes a metal and a non-metal, such as titanium and nitrogen, forming titanium nitride.

As illustrated in the embodiment of FIG. 1 the process 100 includes depositing a barrier layer, such as titanium nitride, using a vapor deposition technique 102 over a work-function metal, gate metal, interlayer dielectric or substrate material and then densifying the deposited layer 104 with plasma ions. Work-function metals include NMOS or PMOS work-function metals such titanium in the case of NMOS and titanium nitride or vanadium nitride in the case of PMOS. Gate metals include, in non-limiting examples, tungsten, aluminum, cobalt, and titanium nitride. Interlayer dielectric or substrate materials include, in non-limiting examples, silicon, silicon germanium, or germanium, and optionally other components, such as doping elements, carbon forming silicon carbide, H for hydrogenated silicon, etc.

Figure 2:
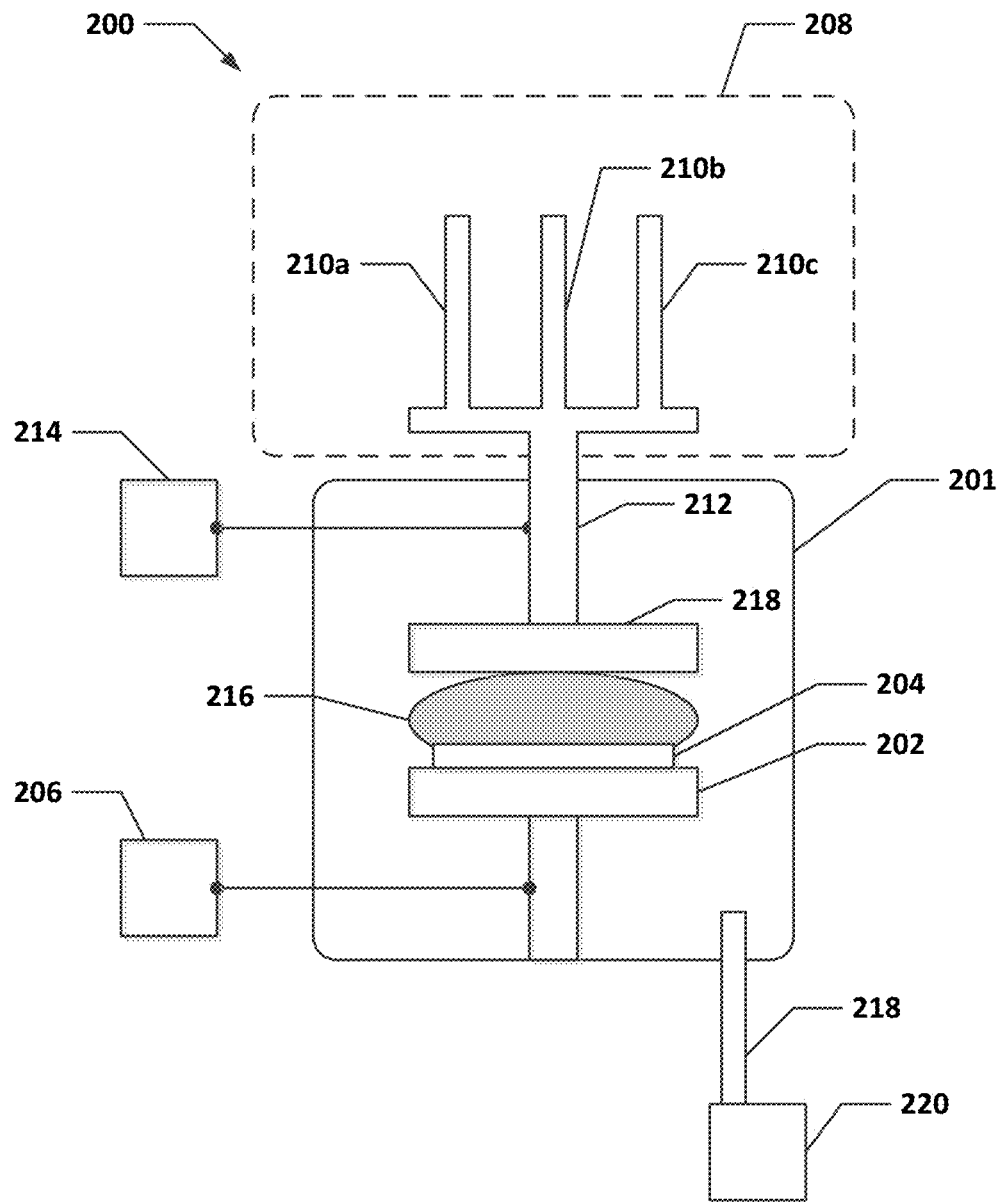
FIG. 2 illustrates a schematic diagram of an embodiment of a reaction chamber for chemical vapor deposition or atomic layer deposition.

In embodiments, chemical vapor deposition techniques or atomic layer deposition techniques are used to deposit the barrier layer, and particularly a titanium nitride layer, in a desired location such as over work function materials in gate stacks or within contact openings. FIG. 2 illustrates an embodiment of a chemical vapor deposition system 200 used for either chemical vapor deposition or atomic layer deposition. The chemical vapor deposition system 200 includes a substrate table 202 for holding a substrate 204, such as a semiconductor wafer, positioned within a reaction chamber 201. In particular embodiments, the reaction chamber 201 is grounded and an electrical bias relative to the ground may be provided to the substrate table by a power source 206. Furthermore, the substrate table 202 is heated to heat the substrate. Optionally, the chamber walls are also heated to prevent condensation of gasses used in the deposition process.

The chemical vapor deposition system also includes gas regulation system 208 including at least one gas inlet, for supplying process gasses to the reaction chamber 201. The process gasses include gas precursors as well as inert gases depending on the layers to be formed and the process (chemical vapor deposition or atomic layer deposition) used to form the layers. As illustrated three gas inlets 210a, 210b and 210c are provided, however a single gas inlet, two gas inlets or up to ten gas inlets may be provided depending on the gasses used in the deposition process. Gas is provided to the inlets from various sources, such as a tank or reservoir, depending on the gas utilized. Further, flow control systems, such as volumetric flow meters, shut-off valve, etc., may be provided to regulate the flow of the gas through the gas inlets, as would be understood by those of ordinary skill in the art. The chemical vapor deposition system also includes an outlet 218 and a vacuum system 220 associated with the outlet 218, including one or more vacuum pumps to evacuate environmental and process gasses from the reaction chamber.

The gas passes from the inlet 210 into the reaction chamber through a distributor 222, such as a shower head, that distributes the gasses over the surface of the substrate 202. The gas may be turned into a plasma 216 proximate to the substrate using a plasma generator, such as a DC plasma generator, RF plasma generator, microwave plasma generator or inductively coupled plasma generator, which includes an appropriate power supply 214 e.g., DC, RF, etc. The plasma generator applies the power between an electrode and the substrate holder 202. Depending on the location of the electrode 224 in the flow path of the gas (represented by the arrow), the gas may become a plasma before or after entering the chamber. Further the electrode 224 may take on a variety of configurations. As illustrated, the electrode 224 includes the gas distribution plate.

In an embodiment of a method of depositing and densifying a barrier layer, the barrier layer precursor gasses are selected from one or more gasses that provide a barrier metal, a non-metal, or a combination thereof. In one embodiment, one gas provides both the barrier metal and non-metal, in another embodiment, a first gas provides the barrier metal and a second provides the non-metal, and in a further embodiment, a first gas provides the barrier metal and a non-metal and a second gas provides a second non-metal. In embodiments, where the barrier layer is a titanium nitride barrier layer, the precursor gas is selected from one or more gasses including titanium and nitrogen. Examples of precursor gasses for use in forming a titanium nitride barrier layer include tetrakis(dimethylamido)titanium and tetrakis(diethylamido)titanium for use in single precursor gas or multiple precursor gas processes and titanium chloride provided in combination with ammonia in multiple precursor gas process systems.

Figure 3:
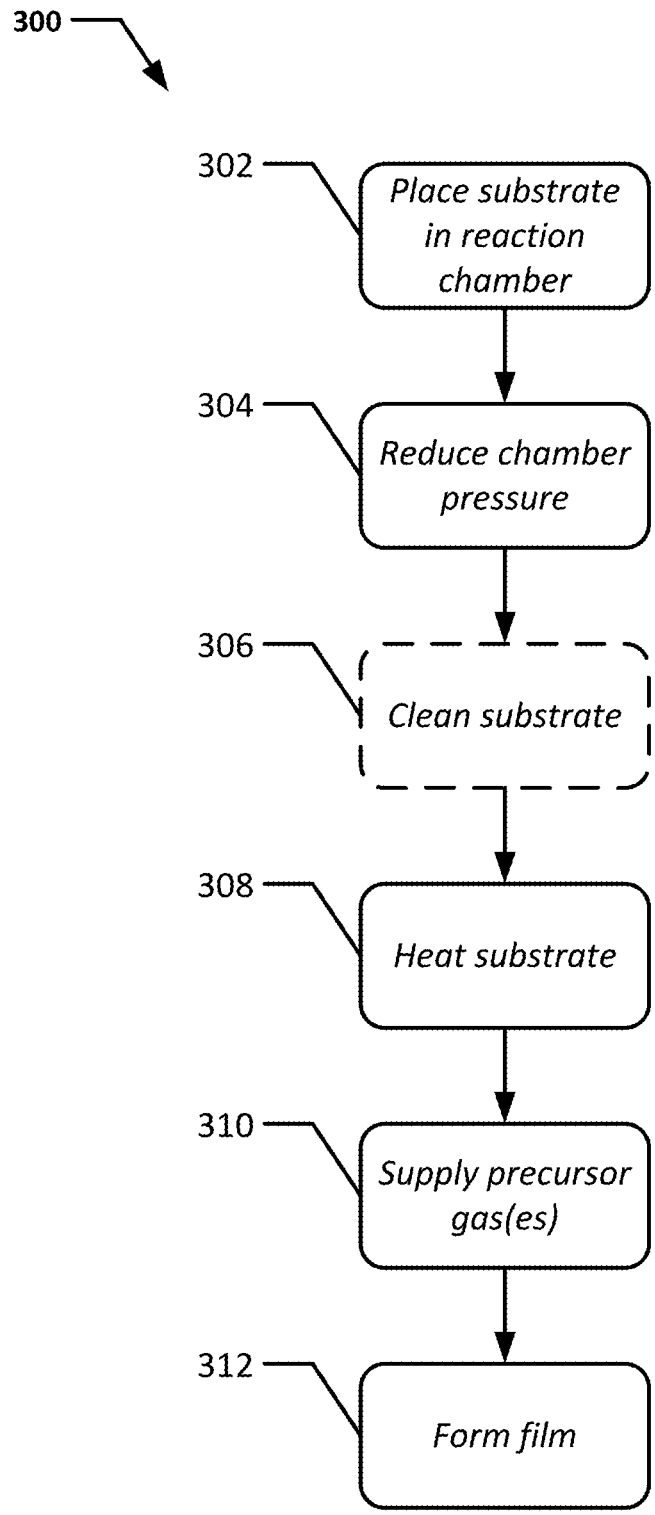
FIG. 3 illustrates a flow chart of an embodiment of chemical vapor deposition prior to densification.

FIG. 3 illustrates a method of chemical vapor deposition 300, the substrate such as a semiconductor wafer, is placed within the reaction chamber 302. The reaction chamber pressure is adjusted 304 to a pressure below $1\times10^{-3}$ torr, such as in the range of $1\times10^{-3}$ to $1\times10^{-8}$ torr or $1\times10^{-6}$ to $1\times10^{-8}$ torr. This is accomplished by the one or more vacuum pumps in one or more stages. The substrate is optionally cleaned 306 using, for example, inert gas plasma, such as Ar. In particular embodiments of the above, the substrate is heated 308 to a temperature in the range of 50° C. to 300° C., including all values and ranges therein, such as 90° C. to 300°, 100° C. to 250° C., 150° C. to 200° C., etc. When the cleaning step is performed, heating may occur during the optional cleaning step 306 or after the optional cleaning step 306.

Then the gas precursors are metered into the reaction chamber together 310. In embodiments, the titanium and nitrogen containing gas(es) such as the tetrakis(dimethylamido)titanium and tetrakis(diethylamido)titanium, are supplied to the reaction chamber using either its own vapor pressure or with the assistance of a carrier gas such as Ar flowing at a rate of 10 sccm to 1000 sccm, including all values and ranges therein. In addition, the precursor gasses may be heated between 30° C. to 200° C. in order to develop sufficient vapor pressure for delivery. The gasses are metered into the chamber for a sufficient period of time such as in the range of 5 seconds to 600 seconds, including all values and ranges therein, to form a film of a desired thickness 312. In embodiments, the pressure of the chamber during deposition is maintained at a pressure below 100 torr, such as in the range of 10 to $1\times10^{-6}$ torr. Furthermore, the deposition process is optionally plasma enhanced, wherein a power applied to the plasma from the plasma generator and power supply is in the range of 25 W to 2000 W, including all values and ranges therein, at a frequency of 350 kHz to 40 MHz, including all values and ranges therein.

Figure 4:
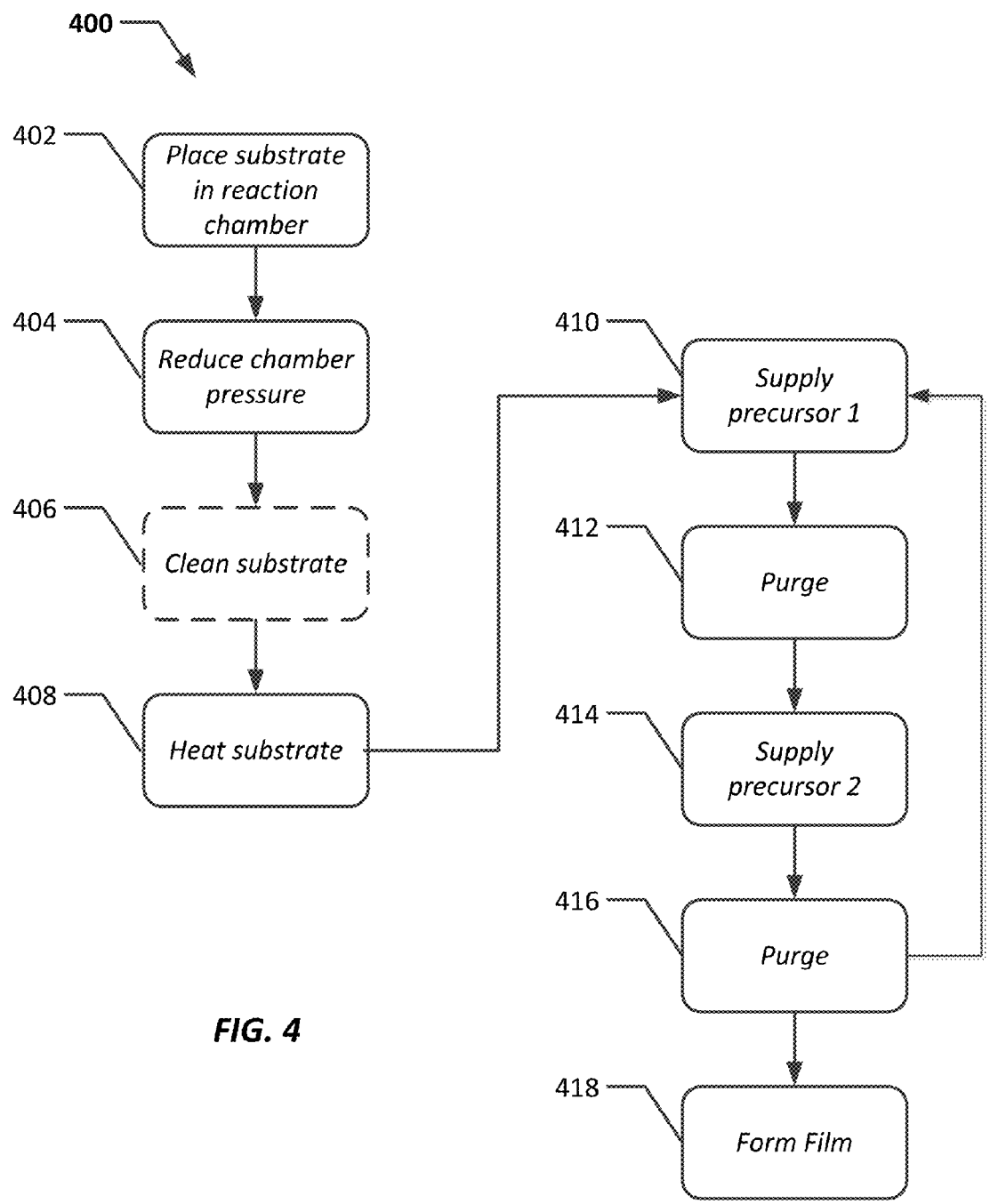
FIG. 4 illustrates a flow chart of atomic layer deposition prior to densification.

In the case of atomic layer deposition 400 illustrated in FIG. 4, a substrate, such as a semiconductor wafer, is placed within a reaction chamber 402. The reaction chamber pressure is brought to a pressure below $1\times10^{-3}$ torr, such as in the range of $1\times10^{-6}$ to $1\times10^{-8}$ torr, see 404. This is accomplished by one or more vacuum pumps in one or more stages. The substrate is optionally cleaned 406 using, for example, inert gas plasma. In particular embodiments of the above, the substrate is heated 408 to a temperature in the range of 50° C. to 300° C., including all values and ranges therein, such as 90° C. to 300° C., 100° C. to 250° C., 150° C. to 200° C., etc. In embodiments, when cleaning is performed, heating may occur during the optional cleaning step 406 or after the optional cleaning step 406.

Then the precursor gasses are metered into the reaction chamber in an alternating manner. In embodiments, a first precursor gas containing titanium, such as titanium chloride, tetrakis(dimethylamido)titanium or tetrakis(diethylamido)titanium, is supplied to the reaction chamber 410 and excess is purged from the chamber 412 utilizing an inert gas such as argon. Then, if the first precursor gas does not contain nitrogen, or if it is advantageous to add additional nitrogen, a second precursor gas containing nitrogen, such as ammonia, is supplied to the reaction chamber 414 and excess is purged from the chamber 416 utilizing an inert gas such as argon. This process continues and is repeated, until a desired layer thickness is achieved and the film is formed 418.

The first precursor is supplied to the reaction chamber with its own vapor pressure or with the assistance of a carrier gas, such as Ar, flowing at a rate of 10 sccm to 1000 sccm, including all values and ranges therein. The first precursor is optionally heated between 30° C. to 200° C. in order to develop sufficient vapor pressure for delivery. The second precursor is supplied to the reaction chamber at a rate of 10 sccm to 1000 sccm, including all values and ranges therein. The second precursor is also optionally heated between 30° C. to 200° C. in order to develop sufficient vapor pressure for delivery. In embodiments, the pressure of the chamber during deposition is maintained at a pressure below 100 torr, such as in the range of 10 to $1\times10^{-6}$ torr. Furthermore, the deposition process is optionally plasma enhanced, wherein a power applied to the plasma from the plasma generator and power supply is in the range of 25 W to 2000 W, including all values and ranges therein, and a frequency in the range of 250 kHz to 40 MHz, including all values and ranges therein. Due to the metering of the precursors in an alternating manner the reactions are self-limiting and the process provides relatively more control over film composition and thickness than chemical vapor deposition.

Figure 5:
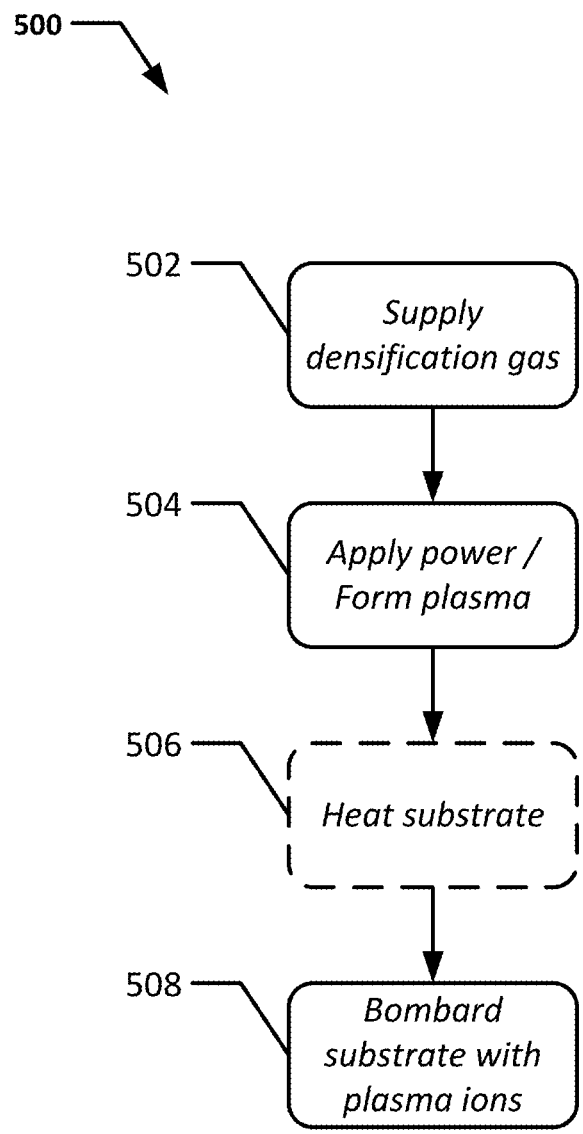
FIG. 5 illustrates a flow chart of an embodiment of plasma densification.

The barrier layer coating is then densified using a direct plasma densification process, such as the process 500 illustrated in FIG. 5. At this point the precursor gas(es) have been reduced and the barrier layer has been deposited. As illustrated, during direct plasma densification one or more densification gasses are supplied to the reaction chamber 502. The densification gas includes an inert gas, such as Ar, and reactive gases such as $H_2$, $N_2$, or $NH_3$, or a combination thereof, is supplied to the reaction chamber at a rate of 10 sccm to 1000 sccm, including all values and increments therein. Alternatively, or in addition to the inert gas, $N_2$ is supplied to the reaction chamber at a rate of 400 sccm to 1000 sccm. The gas is formed into a plasma proximate to the barrier layer 504. In embodiments as illustrated, power in the form of RF, for example, is applied to the gas to form the plasma at 300 W or less, including all value and ranges from 25 W to 300 W, such as in the range of 100 W to 250 W, and at a frequency of 350 kHz to 40 MHz, including all values and ranges therein. Furthermore, densification proceeds for a time period in the range of two seconds to 1,000 seconds, including all values and ranges therein, such as from 100 seconds to 1000 seconds. The substrate is optionally heated 506 to a temperature of 325° C. to 450° C., including all values and ranges therein. The barrier layer is then bombarded with plasma ions 508 densifying the barrier layer.

Prior to densification, the deposited barrier layer thickness is in the range of 0.02 nm to 4.0 nm, including all values and ranges therein. After densification the film thickness is reduced up to 50% of the original film thickness, including all values and ranges therein, such as in the range of 50% to 95% of the original film thickness. In embodiments, the densified barrier layer exhibits a thickness of up to 2 nm including all values and ranges from 0.01 nm to 1.5 nm, such as 0.05 nm, 0.1 nm, 0.5 nm, or 1.0 nm. Should films of greater thickness be desired the process of depositing the barrier material and densifying the barrier material may be repeated a number of times until the desired film thickness is reached. In addition, for each cycle the process parameters, such as gas flow rate, substrate temperature, chamber pressure, densification power, inert gas flow rate, etc., may be adjusted to achieve a coating having different characteristics amongst the deposited layers. As noted above, densification causes the films to increase in density and reduces the film thickness.

In applying power of 300 W or less to the plasma in densifying deposited barrier layers having a thickness of 4.0 nm or less, the densification process may be adjusted to better tune the properties of the barrier layer as compared to when high power densification of 500 W or greater is used. Often, in using a power level of 500 W or greater during densification, the entire volumetric region of the device being treated is densified in a relatively quick time period on the order of 1 second to 2 seconds. Whereas when less power is applied, the region of the device being treated is treated from the top down through the volume in a time period that may be 2 seconds or greater, and in particular embodiments in the range of 100 seconds to 1,000 seconds, where the properties and composition of the coating may be adjusted.

When the precursor gas includes carbon, such as in the case of tetrakis(dimethylamide)titanium, carbon may be present in the resulting barrier layer. In reducing densification power, the amount of carbon present in the barrier layer may be varied, wherein less power applied results in relatively lower amounts of carbon. Higher amounts of carbon also result in proportionately less nitrogen in the film and by adjusting the power, the carbon to nitrogen ratio may be adjusted. The amount of carbon present in the barrier layer may be adjustable in the range of 1 atomic percent to 30 atomic percent of the total atomic percent of the barrier layer, wherein the total atomic percent is equal to 100%, including all values and ranges, and preferably from 10 atomic percent to 30 atomic percent. The amount of titanium present in the barrier layer is in the range of 10 atomic percent to 80 atomic percent, including all values and ranges therein and the amount of nitrogen in the barrier layer is in the range of 10 atomic percent to 80 atomic percent including all values and ranges therein. In high power processes, the amount of carbon is not adjustable and falls within the range of 1 atomic percent to 5 atomic percent of the total alloy composition.

In addition, when using non-metals in the barrier layer such as nitrogen, nitridization of the underlying metal or silicon is reduced. That is, when applying relatively lower power of 300 W or less to the plasma, less nitrogen is removed from the barrier layer and implanted into the underlying material than when utilizing higher power, such as at 500 W or greater. Furthermore, the depth of nitrogen penetration is reduced. In embodiments, the depth of nitrogen penetration is reduced to less than 5 nm into the underlying layer, whereas in higher power processes, nitride penetration goes beyond 5 nm.

In embodiments, the present disclosure is also directed to semiconductor devices formed by processes incorporating the plasma densification process described above. For example, the method may be employed in forming planar transistors, non-planar transistors, contacts for both planar and non-planar transistors, as well as other components, or line interconnect trenches in planar and non-planar devices. Semiconductor devices include, for example, integrated circuits comprising a variety of components, such as transistors, diodes, power sources, resistors, capacitors, inductors, sensors, receivers, transceivers, antennas, etc., and features for forming such components such as interconnects, gates, plugs, etc. The components associated with an integrated circuit may be mounted on or connected to the integrated circuit. An integrated circuit is analog or digital and may be used in a number of applications, such as microprocessors, optoelectronics, logic blocks, audio amplifiers, etc., depending on the components associated with the integrated circuit. The integrated circuit may then be employed as part of a chipset for executing one or more related functions in a computing device, such as a computer, handheld device or portable device.

Figure 6:
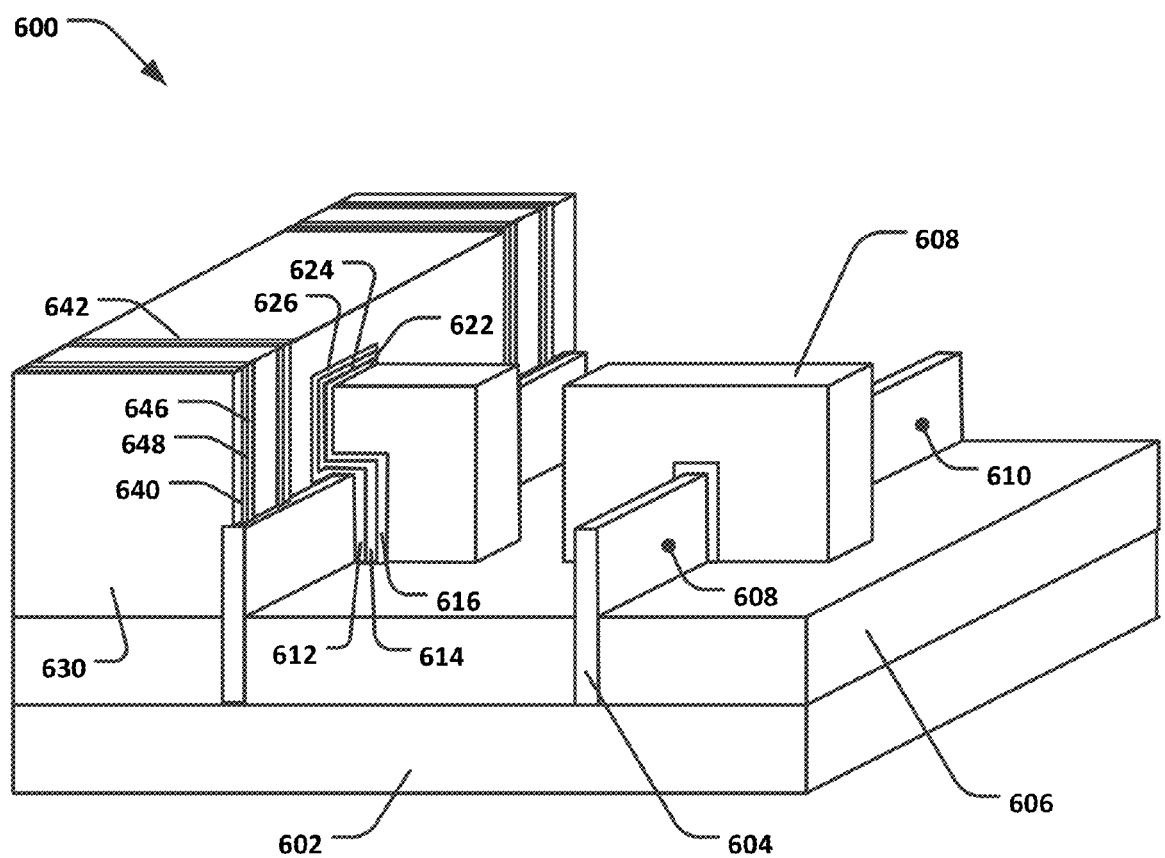
FIG. 6 illustrates an embodiment of a tri-gate transistor with a portion of interlayer dielectric removed.

FIG. 6 illustrates an example of a non-planar tri-gate transistor 600 formed on a semiconductor substrate 602. For purposes of explanation herein, reference is made to the tri-gate transistor. However, the process of deposition and densification may be similarly performed on planar transistors as well as non-planar transistors including gate all around device architectures including, for example, nanowire gates. The tri-gate transistor 600 includes a semiconductor substrate 602 such as p-doped silicon, germanium, gallium arsenide, indium antimonide, lead telluride, indium arsenide, indium phosphide, gallium arsenide, gallium antimonide, and other III/V or II/VI compound semiconductors. Projecting from the semiconductor substrate is a fin 604 formed from the same material as the substrate or, alternatively, a different semiconductor material than the substrate. In examples, the fin is formed by patterning and etching into the substrate surface. While the fin is illustrated as being three sided, other geometries may be provided as well, such as a two sided fin, a four sided fin, a five sided fin, etc. An oxide layer 606 having a thickness in the range of 1 nm to 100 nm is formed over the substrate through which the fin extends. In embodiments, the oxide layer is grown by exposing the substrate to an oxygen rich heated atmosphere. In other embodiments, the oxide layer is deposited using chemical vapor deposition.

A source 608 and drain 610 are formed at the surfaces of the fin 604 on either side of the gate by doping regions of the fin. Ion implantation techniques may be used. Depending on the type of transistor, the dopants may include boron or phosphorous, depending on whether the transistor is an N-type or P-type transistor. Alternatively, or additionally, the source and drain regions are formed by removing portions of the non-planar transistor fin 604 and replacing the portions with an N-type or P-type material as would be understood by those of skill in the art. In yet a further alternative, the source and drain regions are formed by epitaxially growing doped or undoped strain layers on the fin 604.

A gate dielectric 612 is deposited over exposed sides of the fin in the region of the gate. The gate dielectric 612 is formed of a relatively high-k dielectric material having a dielectric constant of greater than 3.9, such as $SiO_2$, $HfO_2$, $Al_2O_3$, $ZrO_2$, $TiAlO_x$, $HfAlO_x$, $AlSiO_x$, $HfSiO_x$, $TaSiO_x$ or lanthanide oxides, and deposited via chemical vapor deposition or atomic layer deposition. The gate dielectric thickness is in the range of 1 nm to 10 nm, including all values and ranges therein.

In embodiments of the above, an intervening layer (not illustrated) is deposited over the gate dielectric prior to depositing the gate dielectric. The intervening layer is selected from nitrides, carbonitrides, carboxynitrides of molybdenum, tungsten, vanadium, niobium, tantalum, titanium, zirconium and hafnium. The intervening layer is in the range of 0.5 nm to 3 nm, including all values and ranges therein.

In embodiments, an NMOS or PMOS work-function material 614 is deposited over the gate dielectric over the exposed sides of the fin. N-MOS work-function materials include, for example, aluminum, titanium, carbon or combinations thereof and is deposited using a conformal coating technique such as chemical vapor deposition or atomic layer deposition. P-MOS work-function materials include, for example, titanium nitride or vanadium nitride. Further, the barrier layer 616 is deposited over the work-function material 614. The barrier layer 616 includes, for example, titanium nitride or a bilayer of titanium and titanium nitride. When present, the titanium is deposited between the work-function material and the titanium nitride using chemical vapor deposition or atomic layer deposition as described above, wherein the first reactive precursor includes, for example, titanium chloride. Then the titanium nitride layer is deposited and densified on the titanium layer according to the methods described herein.

A gate 618 is formed using a gate fill material such as tungsten, titanium nitride, cobalt, or aluminum, using vapor deposition techniques. In one embodiment of forming a tungsten gate, a nucleation layer is formed using pulsed diborane and tungsten hexafluoride followed by tungsten growth using tungsten hexafluoride and hydrogen gas precursors in a chemical vapor deposition process. The titanium nitride barrier layer protects the underlying titanium layer from the fluorine constituents of the tungsten hexafluoride gas.

Furthermore, a capping layer 622, is deposited over the gate. In embodiments, the capping layers include a capping layer of a high-k dielectric material 622 deposited over the gate 618. An additional capping layer 624 with a hermetic conductive layer such as, but not limited to Ru(P), Ru(B), TiN, TiAlN, or TaN, may also be employed between the gate and the dielectric layer. Alternatively, a bi-layer capping structure is employed wherein a layer of titanium 626 is deposited over the hermetic conductive layer. Again, the hermetic conductive layer may be deposited and densified according to the embodiments discussed herein.

Furthermore a dielectric layer 630 is formed over the gate 618, work function material 614, barrier layers 616 and exposed portions of the substrate. The dielectric layer is formed of, for example, a low k-dielectric having a dielectric constant of 3.9 or less, including silicon dioxide, fluorine doped silicon dioxide, carbon doped silicon dioxide, porous silicon dioxide, polyimide, polynorbornenes, benzocyclobutene, PTFE, hydrogen silsesquioxane (HSQ) and methylsilsesquioxane (MSQ).

Various techniques may be used to form the tri-gate transistors described above. For example, in one embodiment, a sacrificial layer may be formed over the substrate and fin. A portion of the sacrificial layer is removed to expose all three surfaces of the fin along a portion of the fin length to form a sacrificial gate trench over the fin. Then the sacrificial gate may be formed within the gate trench and the sacrificial material surrounding the sacrificial gate may be removed. Gate spacers may then be formed by depositing a dielectric layer of, for example, silicon nitride or silicon carbide, over the sacrificial gate and substrate. The dielectric layer may then be anisotripically etched exposing the surface of the gate and the substrate, and leaving the dielectric layer on either side of the sacrificial gate to form gate spacers. The source and drain regions may then be formed on the fin by a doping processing, such as plasma ion bombardment.

A second dielectric layer may then be formed over the gate spacers, sacrificial gate, fin and substrate and then planarized to again expose the sacrificial gate. The sacrificial gate may then be removed forming another gate opening. The gate opening may then be lined with a dielectric layer and, on top of that, a work function material. Upon the work function material a barrier layer is deposited, which may include titanium nitride or a bilayer of titanium and titanium nitride. After this, the gate is formed in the gate opening and the gate then capped with the various capping layers. An additional dielectric is deposited over the capping layers. As would be understood by those of ordinary skill in the art, a number of intermediate patterning, etching and polishing steps occur at various points in the process above.

In addition to or alternatively to the above, the methods described may be used to form contact or interconnect liners. Contacts, or plugs, connect power and signal carrying interconnects to the gates, source regions and drain regions of the transistor. Referring again to the embodiment set forth in FIG. 6, a contact opening 640 and an interconnect trench are formed in the interlayer dielectric 630. The surface of the dielectric is patterned and etched to form trenches and contact openings are etched through the dielectric 630 until the source or drain region of the fin 604 is exposed. One or more barrier layers are deposited on the contact opening and interconnect walls, including a titanium and titanium nitride bilayer 646, 648, which may be formed according to the deposition and densification methods described above. Contacts and interconnects may then be deposited by processes such as chemical vapor deposition, plasma vapor deposition or electroplating. Contact and interconnect metals may include, for example, copper, aluminum, or tungsten. While not illustrated additional capping layers are deposited over the interconnects and contacts.

Using the processes described above, an improvement in transistor drive at less than 5 nm layers on a fin transistor is greater than 10% and up to 30% to 40%. This allows the reduction of work function metal thickness from 10 nm to 15 nm down to 4 nm to 5 nm. On other hand, when using the process herein and maintaining metal thickness consistent, the performance is improved by 30 to 40% by.

Thus, an aspect of the present disclosure relates to a method of forming a barrier layer on a semiconductor device. The method includes placing a substrate into a reaction chamber and depositing a barrier layer over the substrate. The barrier layer includes a metal and a non-metal and the barrier layer exhibits an as-deposited thickness of 4 nm or less. The method further includes densifying the barrier layer by forming plasma from a gas proximate to said barrier layer and reducing the thickness and increasing the density of the barrier layer. In embodiments, 300 Watts or less of power is applied to the plasma during densification at a frequency of 350 kHz to 40 MHz.

In an embodiment of the above, the method further includes depositing a metal layer before depositing the barrier layer and depositing the barrier layer over the metal layer. In examples, the metal layer comprises titanium and the barrier layer comprises titanium nitride. In addition, in any of the above embodiments, the method further includes depositing a metal layer over the barrier layer. For example, the metal layer includes tungsten or copper, wherein the metal may form, for example, contacts or interconnects. Further, in any of the above embodiments, the method further includes depositing a high-k dielectric layer between the substrate and the barrier layer.

In any of the above embodiments, the barrier layer is deposited by supplying one or more reactive gas precursors to the reaction chamber. In particular embodiments of the above, the reactive gas precursor comprises tetrakis(dimethylamido)titanium and the barrier layer comprises titanium, nitrogen and carbon. In examples, the deposited barrier layer comprises carbon present in the range of 1 atomic percent to 30 atomic percent, titanium present in the range of 20 atomic percent to 80 atomic percent and titanium nitride present in the range of 20 atomic percent to 80 atomic percent of the total atomic percent of the barrier layer. In addition, in any of the above embodiments, the substrate is heated at a temperature in the range of 325° C. to 450° C. while densifying the barrier layer.

In a related aspect, the present disclosure relates to a method of forming a barrier layer on a semiconductor device. The method includes placing a substrate into a reaction chamber, depositing a titanium layer on the substrate, depositing a titanium nitride barrier layer over the titanium layer, densifying the barrier layer by forming plasma from a gas supplied to the reaction chamber, and reducing the thickness and increasing the density of the barrier layer. In such a method, the titanium nitride barrier layer is deposited at a thickness of 4 nm or less and 300 Watts or less of power at a frequency in the range of 350 kHz to 40 MHz is applied to the plasma in densifying the barrier layer.

In embodiments of the above, the titanium nitride layer is deposited using tetrakis(dimethylamido)titanium precursor. In such embodiments, the deposited barrier layer comprises carbon present in the range of 1 atomic percent to 30 atomic percent, titanium present in the range of 20 atomic percent to 80 atomic percent and titanium nitride present in the range of 20 atomic percent to 80 atomic percent of the total atomic percent of the barrier layer. Furthermore, in any of the above embodiments, after densifying the barrier layer, nitrogen penetrates into the titanium layer to a depth of less than 5 nm.

In any of the above embodiments, the method further includes depositing a metal over the titanium nitride barrier layer, wherein the metal is tungsten. In addition, in any of the above embodiments, the method also includes depositing a metal over the titanium nitride barrier layer, wherein the metal comprises copper. In addition or alternatively, the method includes depositing a contact metal over the titanium nitride barrier layer, wherein the substrate is an interlayer dielectric.

In any of the above embodiments, substrate includes a fin projecting from the substrate.

In yet a further aspect, the present disclosure relates to a semiconductor device formed according to the methods described above. In embodiments, the semiconductor device includes features such as transistors, contacts or interconnects. In any of the above embodiments, the features include critical dimensions in the range of 5 nm to 30 nm, and preferably in the range of 5 nm to 22 nm and more preferably in the range of 5 nm to 14 nm. Further, in any of the above embodiments, the barrier layers are used at contact metal to silicon interfaces or in gate metal stacks. In addition or alternatively, in any of the above embodiments, the barrier layers are used as capping layers. Accordingly, in embodiments, a metal layer is disposed between the substrate and the barrier layer. In addition, or alternatively, a metal layer is disposed on the barrier layer and forms either a gate or a contact. In yet another aspect, the present disclosure relates to an integrated circuit formed according to the methods described above including such semiconductor devices.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. A semiconductor device, comprising:
    a substrate comprising at least one feature having a critical dimension in the range of about 5 nanometers (nm) to less than about 30 nm;
    an underlayer on the substrate, the underlayer comprising an upper surface, lower surface, and first and second side surfaces;
    a barrier layer comprising a nitride on the underlayer; and
    a fin on the substrate;
  wherein:
    nitrogen is present in said underlayer to a depth of less than 5 nm from said upper surface, lower surface, or first or second side surfaces;
    said barrier layer has a first thickness of greater than 0 to less than or equal to 2 nanometers (nm);
    at least a portion of said underlayer is disposed on said fin; and
    at least a portion of the barrier layer is disposed on at least the portion of the underlayer that is disposed on said fin.

2. The semiconductor device of claim 1, wherein the first thickness is greater than 0 to less than or equal to 1 nm.

3. The semiconductor device of claim 1, wherein the nitride comprises a metal nitride.

4. The semiconductor device of claim 3, wherein:
    the barrier layer comprises titanium nitride; and
    the underlayer comprises titanium.

5. The semiconductor device of claim 4, wherein:
    said underlayer has a second thickness between the upper and lower surfaces or between the first and second side surfaces; and
    said second thickness is greater than 5 nm.

6. The semiconductor device of claim 1, wherein the underlayer comprises a metal.

7. The semiconductor device of claim 1, wherein at least a portion of the underlayer does not contain nitrogen.

8. The semiconductor device of claim 1, further comprising a gate dielectric layer, wherein at least a portion of the gate dielectric layer is between said underlayer and said fin.

9. The semiconductor device of claim 8, further comprising a work function material (WFM) layer, wherein at least a portion of the WFM layer is between the gate dielectric layer and said underlayer.

10. The semiconductor device of claim 8, wherein the WFM layer is a layer of an NMOS or PMOS work function material.

11. The semiconductor device of claim 10, wherein the barrier layer comprises titanium nitride.

12. The semiconductor device of claim 1, wherein said underlayer comprises a work function material (WFM).

13. The semiconductor device of claim 12, wherein the barrier layer comprises titanium nitride.

14. The semiconductor device of claim 1, further comprising an interlayer dielectric on the substrate, the interlayer dielectric comprising an interconnect trench comprising at least one wall, wherein at least a portion of the underlayer is disposed on at least a portion of the wall of the interconnect trench and at least a portion of the barrier layer is disposed on the portion of the underlayer that is on the wall of the interconnect trench.

15. The semiconductor device of claim 12, wherein the barrier layer comprises titanium nitride.

16. The semiconductor device of claim 1, further comprising an interlayer dielectric on the substrate, the interlayer dielectric comprising an contact opening, wherein at least a portion of the underlayer is disposed on the contact opening, and at least a portion of the barrier layer is disposed on the portion of the underlayer that is on the contact opening.

17. The semiconductor device of claim 16, wherein the barrier layer comprises titanium nitride.

18. The semiconductor device of claim 1, wherein the semiconductor device is a tri-gate transistor.

19. The semiconductor device of claim 14, wherein the semiconductor device is a tri-gate transistor.

20. The semiconductor device of claim 16, wherein the semiconductor device is a tri-gate transistor.

21. A semiconductor device, comprising:
    a substrate comprising at least one feature having a critical dimension in the range of about 5 nanometers (nm) to less than about 30 nm;
    an underlayer comprising titanium on the substrate, the underlayer comprising an upper surface, lower surface, and first and second side surfaces;
    a barrier layer comprising titanium nitride on the underlayer;
  wherein:
    nitrogen is present in said underlayer to a depth of less than 5 nm from said upper surface, lower surface, or first or second side surfaces; and
    said barrier layer has a first thickness of greater than 0 to less than or equal to 2 nanometers (nm);
    said underlayer has a second thickness between the upper and lower surfaces or between the first and second side surfaces; and
    said second thickness is greater than 5 nm.

* * * * *